United States Patent [19]

Pregont et al.

[11] Patent Number: 5,351,245
[45] Date of Patent: Sep. 27, 1994

[54] BIT ERROR RATE DETECTION METHOD

[75] Inventors: Gary J. Pregont, Dundee; David G. Cason, Palatine; Jeffrey D. Goetsch, Lindenhurst, all of Ill.

[73] Assignee: Motorola Inc., Schaumburg, Ill.

[21] Appl. No.: 152,951

[22] Filed: Nov. 15, 1993

Related U.S. Application Data

[63] Continuation of Ser. No. 770,199, Oct. 2, 1991, abandoned.

[51] Int. Cl.$^5$ .......................... G11B 11/00; H04B 7/00
[52] U.S. Cl. ...................... 371/5.1; 371/5.2; 371/20.2; 371/20.4; 371/39.1
[58] Field of Search .................... 371/5.1, 5.2, 5.4, 5.5, 371/20.1, 20.4, 20.2, 39.1, 43; 455/52; 370/82, 94; 375/107

[56] References Cited

U.S. PATENT DOCUMENTS

| | | | |
|---|---|---|---|
| 4,363,123 | 12/1982 | Grover | 371/5 |
| 4,519,068 | 5/1985 | Krebs et al. | 370/82 |
| 4,616,362 | 10/1986 | Schiff | 371/5 |
| 4,670,889 | 6/1987 | Hewitt | 375/107 |
| 5,060,292 | 10/1991 | Ayukawa et al. | 455/52 |
| 5,121,395 | 6/1992 | Millar | 371/39.1 |
| 5,166,890 | 11/1992 | Smischny | 371/5.1 |
| 5,182,753 | 1/1993 | Dahlin et al. | 371/43 |
| 5,214,687 | 5/1993 | Känsäkoski et al. | 371/5.1 |

FOREIGN PATENT DOCUMENTS

0405384A2  6/1990  European Pat. Off. .

OTHER PUBLICATIONS

Distler et al, "Error Signature Test System", AT&T Bell Laboratories, Holmdel, Technical Digest, No. 77, Oct. 1985, pp. 19–20.

Peter Harold, "Bit-Error-Rate Testers Troubleshoot Data Links in Real Time", EDN Feb. 5, 1987, pp. 69–78.

*Primary Examiner*—Hoa T. Nguyen
*Attorney, Agent, or Firm*—Kirk W. Dailey

[57] ABSTRACT

The present disclosure includes a discussion of a bit error rate detection method for use in a digital radio communication system. The digital radio communication system contains multiple radios which transmit and receive radio frequency (RF) signals. The RF signals are formatted into multiple frames, each frame has a predetermined number of data bits, a subset of which have known values. A first frame of data is transmitted. The first frame is received and the subset of known data bits are extracted. Each data bit of the received subset of known data bits are compared to the known set of data bits and a counter is incremented in response to each comparison which results in difference between the received bit and the set of known bits. The counter value is used to determine a bit error rate of the received first frame at a predetermined confidence level.

2 Claims, 4 Drawing Sheets (EXAMPLE) DOWNLINK SACCH (A) FULL-RATE (B) HALF-RATE

DETECTION PRECISIONS

| STANDARD BER (%) | PRESUMED BER (%) |
|---|---|
| 5.5 | 3 BER |
| 1.6 | 1 BER< 3 |
| 0.55 | 0.3 BER< 1 |
| 0.10 | BER< 0.3 |

BIT ERROR RATE DETECTION METHOD

This is a continuation of application Ser. No. 07/770,199, filed Oct. 2, 1991 and now abandoned.

FIELD OF INVENTION

This invention generally relates to bit error rate measurement and more specifically to a bit error rate measurement method in a digital radio communications system.

BACKGROUND OF THE INVENTION

Bit error rates are used to determine the quality of a transmission of digital data from one point to another. Generally, in communication systems the actual bit error rate is undeterminable because the information being transferred is typically unknown to the receiver prior to its receiving the information, therefore, a method of accurately estimating the quality of transmission between two devices in a communication system is desired. Radio communications systems in particular have a need for an accurate probable bit error rate generator, because, radio systems have a much higher probability of transmission problems than a wire communication system does. Without an indication of transmission quality, a radio receiver which does not receive the desired transmitted information may interpret the noise received as data, this can lead to severe malfunctions while operating the radio.

Therefore, a need exists for a method of bit error rate detection for use in a digital communications system so that poor transmission quality can be detected by the radio receiver and properly handled without detrimentally affecting the radio's operation.

SUMMARY OF THE INVENTION

The present invention encompasses a method of detecting bit errors of a digitally encoded signal formed of a plurality of sequentially transmitted data bits. The sequentially transmitted bits are grouped to form frames containing a predetermined number of bits. The method decodes a first frame of sequentially transmitted data bits. The decoding determines if the first frame of sequentially transmitted data bits contains 0, 1, or more than 1 error. A counter is then incremented by 1 if 1 error is detected or by 2 if more than 1 error is detected. The counter value and the total number of bits transmitted are used to determine the bit error rate of the transmission.

DETAILED DESCRIPTION OF A PREFERRED EMBODIMENT

The present invention was developed in response to the Research and Development Center for Radio Systems (RCR) Standard 27 which is used to govern the Japan Digital Cellular Radiotelephone System. The RCR Standard 27§3.4.3.11, published on Apr. 30, 1991, defines the circuit quality detection precision specification. The specification requires the radiotelephone to be able to identify four levels of signal circuit quality detection. The present invention utilizes synchronization words, Radio Channel (RCH) fields and Slow Associated Control Channel (SACCH) fields to determine the bit error rate at an 80% confidence level to meet the specifications required by RCR Standard 27.

Figure 1:
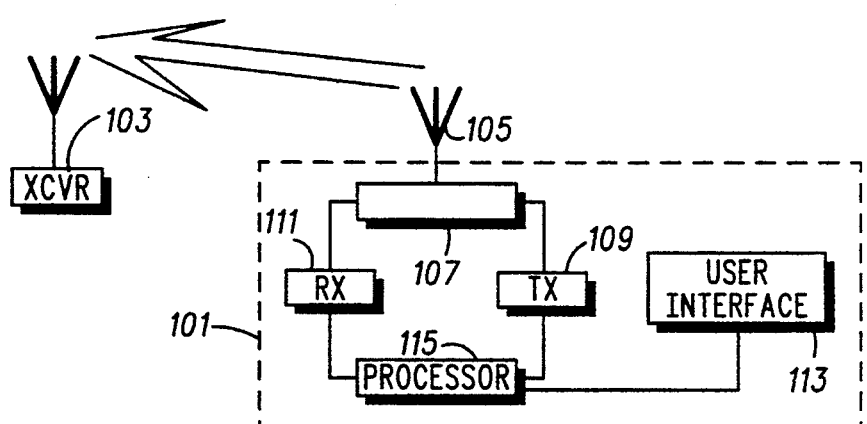
FIG. 1 is an illustration of a digital radiotelephone communications system which may employ the present invention.

FIG. 1 illustrates a digital radiotelephone communications system, such as that employed in the Japan Digital Cellular Radiotelephone System. Within this radiotelephone system, the fixed site transceiver 103 services mobile and portable radiotelephones located within a geographic area served by the fixed site transceiver 103. One such portable radiotelephone is radiotelephone 101. The radiotelephone 101 sends and receives radio frequency (RF) signals to and from the fixed site transceiver 103 via the antenna 105. The radiotelephone 101 includes a receiver 111, a transmitter 109, an user interface 113, and a processing system 115. The processing system includes a microprocessor, a digital signal processor, and their associated memory and logic devices.

Upon reception of RF signals, the antenna 105 converts the RF signals received from the fixed site transceiver 103 into electrical RF signals. These electrical RF signals are then routed into the receiver 111. The receiver 111 demodulates the electrical RF signals, detects the data contained within the electrical RF signals and formats the detected data into a known configuration for use by the rest of the radiotelephone 101. The processing system 115 is used to decode the detected data and determine the presumed bit error rate (BER). Additionally, the processing system 115 converts the detected data into voice and outputs it to the user interface 113.

Upon transmission of RF signals, the user interface 113 receives voice from the user, transmits the voice signals back to the processing system 115. Here, the processing system 115 encodes the data and outputs the data to the transmitter 109. The transmitter 109 modulates the data input from the processing system 115, converting it into electrical RF signals. The electrical RF signals are converted to RF signals by the antenna 105 and output into the air for reception by the fixed site transceiver 103.

Figure 2:
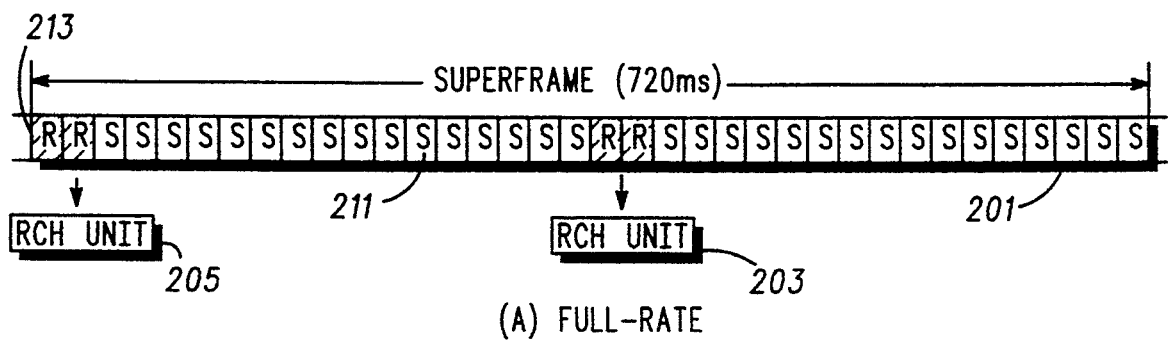
FIG. 2 is an illustration of a format used in a time division multiple access (TDMA) communication system which may employ the present invention.
Figure 2:
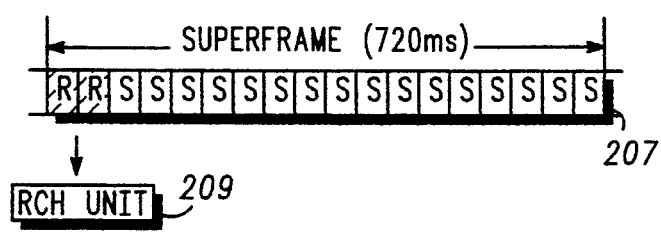

FIG. 2 illustrates the format of the data which is transmitted and received by the fixed site transceiver 103 and the radiotelephone 101, and utilized by the processing system 115. FIG. 2A is an illustration which contains a superframe of data 720 milliseconds in duration and contains 36 frames of data. Each frame of data contains 280 data bits. Of the 280 data bits, 20 of the data bits are a synchronization word which has a known pattern of data. In the preferred embodiment, one of 12 possible synchronization words are used. In addition to the synchronization word, there is a 21 bit field in each frame. Depending on which frame, the frame either contains radio channel (RCH) information or slow associated control channel (SACCH)information. For illustration purposes, the frames containing an R, such as frame 213, contain a RCH field, and the frames containing an S, such as frame 211, contain a SACCH field.

The RCH field is in 4 of the 36 data frames per superframe and contains one of the following three messages: a transmission power control message, a time alignment message, or a downlink power setting message. These messages contain housekeeping information and are described in the RCR Standard 27§4.1.4.4 and subsequent. The RCH control bits are used by the layer one software within the radiotelephone 101 to control basic functions of the radiotelephone 101. Layer one software is defined as the first of seven layers contained in the Open System Interconnection (OSI) seven layer software protocol.

The SACCH fields which are contained in the other 32 time slots not occupied by the RCH field contain layer three software controls. Layer three software is the Network Layer of the OSI standard seven layer protocol which performs supervisory type tasks. The command messages sent in the SACCH field include: a hand over radio channel set message, a system information message, a condition inquiry message, a condition report acknowledge message, a condition report information message, a condition report state message, and a VOX (voice operated transmission) control message. These are further described in the RCR Standard 27§4.3.5.2.7 through 4.3.5.2.18.

Figure 3A:
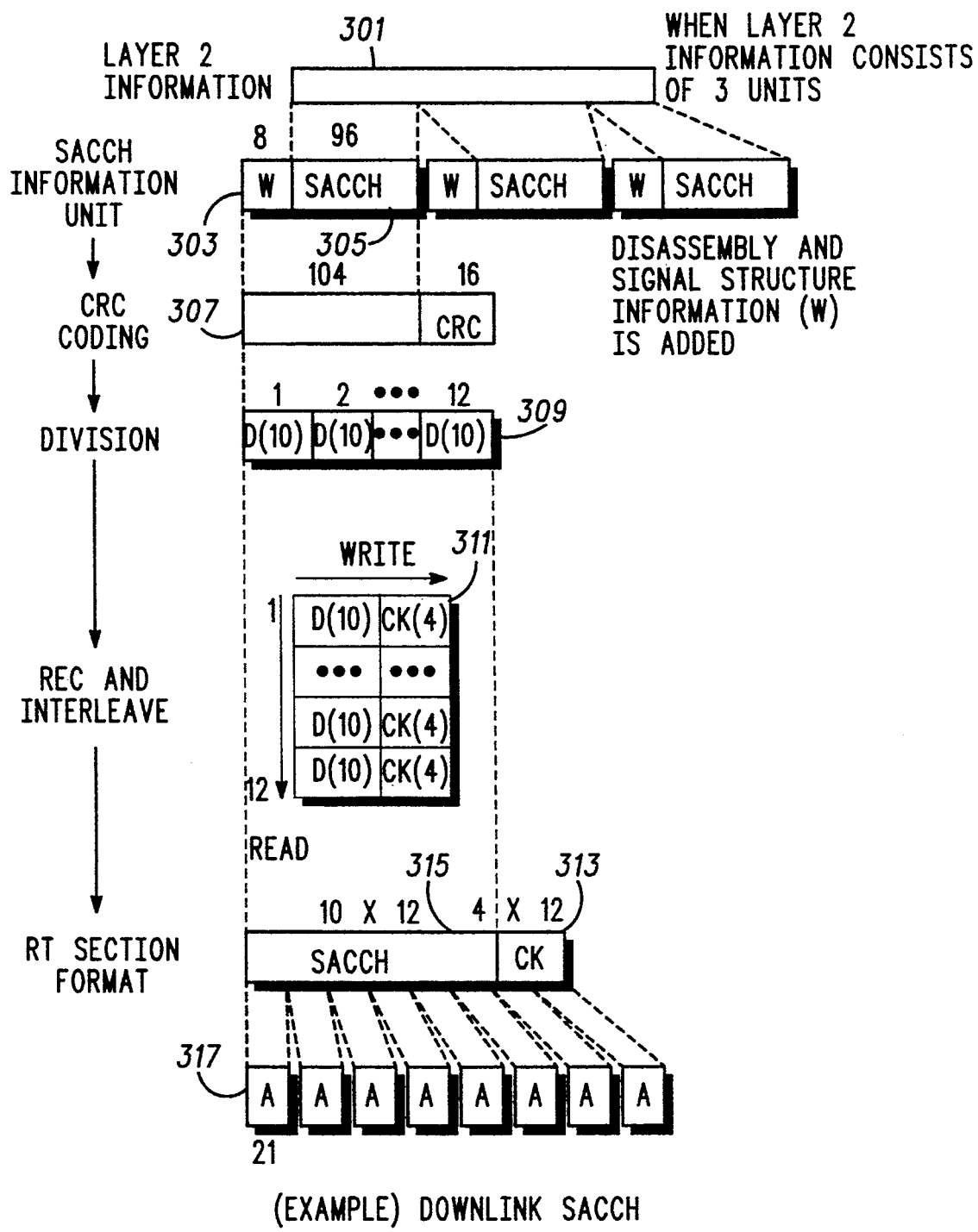
FIG. 3A is an illustration of a SACCH signal assembly and disassembly in a system which may employ the present invention.
Figures 3B, 4:
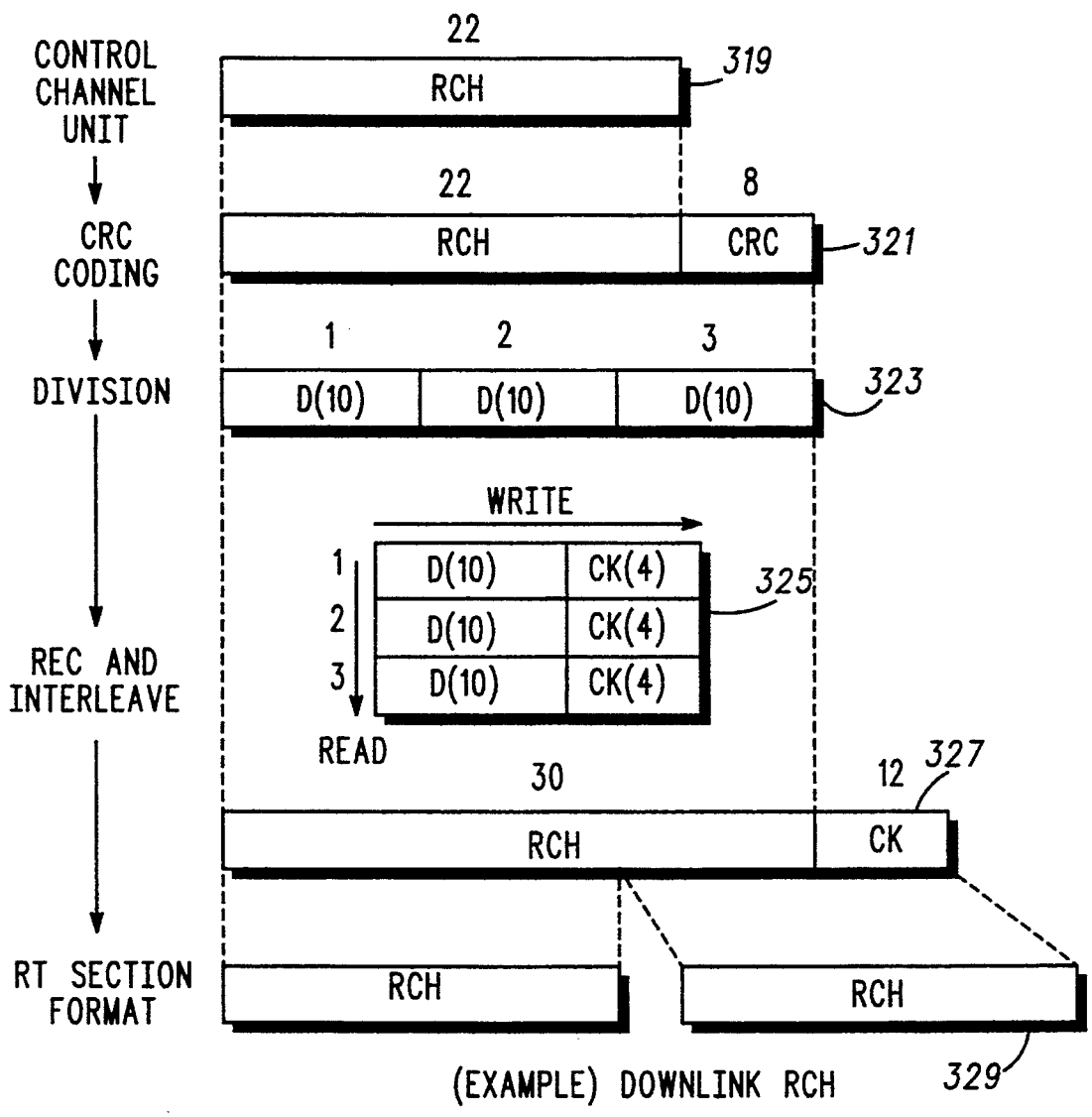
FIG. 3B is an illustration of a RCH signal assembly and disassembly in a system which may employ the present invention.
FIG. 4 is a chart of the four bit error rate levels which the radiotelephone system in the preferred embodiment must be able to detect.

FIG. 2B is a similar data format as discussed in FIG. 2A, the difference being that the data is sent at a halfrate. In a half rate channel, the radiotelephone 101 uses every other frame that it would use on a full rate channel. This results in a superframe having 18 frames, two of the frames contain RCH fields and the remaining 16 contain SACCH fields, as well as, all 18 frames containing synchronization words. Upon transmission of data from the fixed site transceiver 103 to the radiotelephone 101, the SACCH and the RCH fields are encoded as illustrated in FIGS. 3A and 3B respectively. Block 305, in FIG.3A contains one SACCH information unit extracted from a Layer 2 information block 301. Eight additional structure information bits 303 were added to the SACCH block 305. Next, the SACCH block 303, 305 are Cyclic Redundancy Coded (CRC), this adds an additional 16 bits onto the SACCH block 307. The SACCH block 307 is then divided into 10 bit pieces as illustrated in block 309. Each 10 bit piece is Bose, Chaudhuri, Hocquenghen (BCH) encoded, resulting in 12-fourteen bit words. These resultant blocks are interleaved. Interleaving is used to protect against bursts of noise on an RF channel during a transmission. The process of interleaving is accomplished by reordering the bits of the twelve 14-bit pieces. The reordering creates a serial bit stream using the first bit from each 14-bit piece, then the second bit from each 14-bit piece and so on ..., as illustrated in block 311. The resulting bit stream 315,313 is divided into eight 21-bit pieces as illustrated in block 317.

FIG.3B is similar to FIG.3A except that the RCH information is only 22 bits at block 319 as opposed to the 104 bits of SACCH information in block 305. The RCH field is CRC coded resulting in block 321. Block 321 is divided into 10 bit pieces resulting in block 323. The 10-bit pieces are BCH encoded adding the additional 4 bits to each 10-bit piece. These pieces are then interleaved at 325. The resulting serial bit stream 327 is divided into two 21-bit pieces for transmission as illustrated by block 329. Each of these 21 bit SACCH and RCH fields are included in a frame. Together the frames form a superframe as illustrated in FIG.2. The superframe 201 is converted to RF signals and transmitted to the radiotelephone 101.

Upon reception of the RF signals containing the aforementioned superframe of data by the radiotelephone 101, the receiver demodulates the RF signals for use by the radiotelephone 101. The processing system 115 de-interleaves the data, reversing the process described in the preceding paragraphs; resulting in three 14-bit words for the RCH field and twelve 14-bit words for the SACCH data field. Next, the processing system 115 BCH decodes the RCH and the SACCH fields. The BCH decoding reveals if the 14-bit words contains 0, 1, or more than 1 error. The CRC check is then executed resulting in a 22-bit RCH field and a 104-bit SACCH field. Additionally, the processing system 115 compares the synchronization word received by the radiotelephone 101 to the known bit pattern bit for bit. Each bit different in the received synchronization word is recorded.

The errors detected in the BCH decoding and the synchronization word detecting are used by the processing system 115 to generate an estimated bit error rate. The RCR Standard 27 under §3.4.3.11 requires four levels of bit error rate estimation to be detected by the radiotelephone 101. FIG. 4 illustrates the four levels. On the right side of the table 401, the presumed bit error rate percentage gives a certain range of values which are used to determine the standard bit error rate percentage on the left side of table 401.

Figure 5:
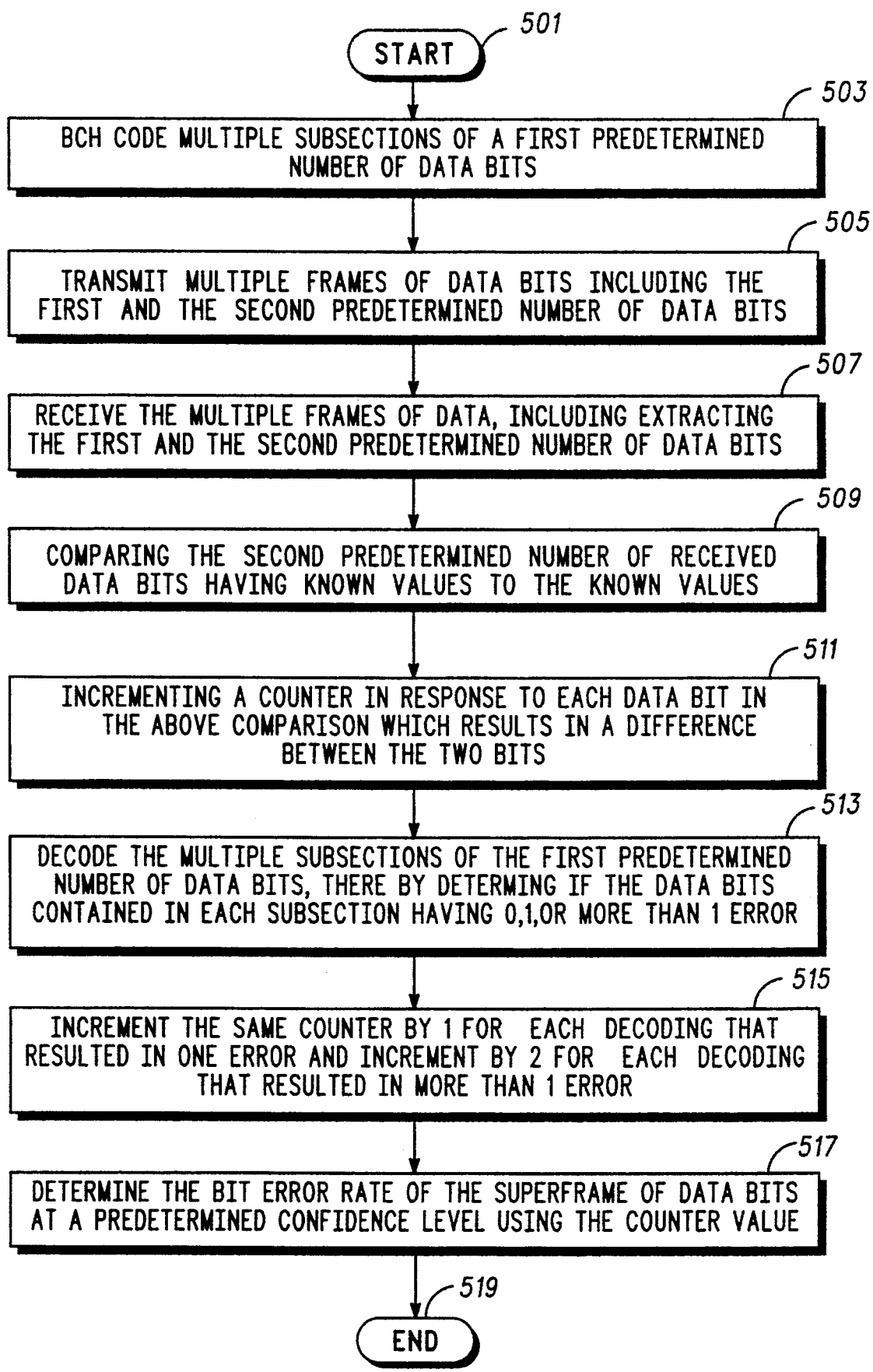
FIG. 5 is a process flowchart of the method employed by the present invention.

FIG. 5 illustrates the method of determining the estimated bit error rate of the transmission of RF signals between the fixed site transceiver 103 and the radiotelephone 101. The method begins at 501 in the fixed site transceiver 103. Prior to transmission, a first predetermined number of data bits are BCH coded at function block 503. In the preferred embodiment, the first predetermined number of data bits are the RCH field and the SACCH field divided into 14-bit sub-sections.

At function block 505, a superframe of data bits are transmitted, the superframe of data bits include the first predetermined number of BCH coded data bits and a second predetermined number of bits having a known value at function block 505. In the preferred embodiment, the second predetermined number of data bits are the synchronization words.

At function block 507, the superframe of data bits transmitted by the fixed site transceiver 103 are received by the radiotelephone 101 and the first and second number of predetermined data bits are extracted from the incoming signals. At function block 509, the second predetermined number of received data bits having known values are compared to the known values. At function block 511, a counter is incremented in response to each received data bit in the aforementioned comparison which differs from the known value. At the function block 513, the first predetermined number of data bits formatted into multiple 14-bit sub-sections are BCH decoded, thereby determining that the data bits contained within the subsections have 0, 1 or more than 1 error. At function block 515, the same counter is incremented by 1 for each of the aforementioned BCH decodes which found one error in the sub-section or the counter is incremented by 2 for each of the BCH decodes which found more than 1 error in the sub-section.

At function block 517, the bit error rate is calculated by dividing the counter value by the number of received bits in the first and second predetermined number of data bits. Namely, these are the data bits which are contained in the RCH, the SACCH fields and the synchronization word. In the preferred embodiment, in order to obtain an 80% confidence level the RCH field and the SACCH field account for 756 bits of the superframe and the synchronization field accounts for 720 bits of the superframe, therefore, 1476 bits of the 10,080 bits contained in a superframe are used to determine the bit error rate. The estimated BER is derived by dividing the counter value by 1476 and multiplying the result by 100 having an 80% confidence level in the result. If other confidence levels are desired, the ratio of known bits to unknown bits may be varied, for example, if a 95% confidence level is desired, we may transfer 3300 known bits per superframe and use them to determine the bit error rate.

Note that a combination of the BCH encoded data and the known data bits is not necessary, an equally sufficient estimated bit error rate may be acquired by sending only a first predetermined number of BCH encoded data bits which is larger and none from the second predetermined number of data bits that have known values. Likewise, we can send a second predetermined number of data bits have known values and none of the first predetermined number of data bits which are BCH encoded. The embodiment described herein is a method of determining an estimated bit error rate of the received signal in a digital radiotelephone communications system which meet the requirements of RCR Standard 27.

What is claimed is:

1. A method for determining bit error rate in a digital radio communication system, the communication transmitting and receiving radio frequency (RF) signals, the RF signals formatted into multiple frames, each frame having a first predetermined number of data bits having a predetermined pattern and a second predetermined number of data bits encoded with error correction code, the method comprising the steps of:

transmitting a first frame of the RF signals including transmitting said first and second predetermined number of data bits;

receiving said first frame, extracting said first predetermined number of data bits and second encoded predetermined number of data bits;

comparing the extracted first predetermined number of data bits with the predetermined pattern;

incrementing a first counter value by 1, responsive to said step of comparing, for each data bit of the first predetermined number of data bits that is unmatched to said predetermined pattern;

decoding said encoded second predetermined number of data bits, thereby determining that said second predetermined number of received data bits contains a number of errors chosen from the group of 0, 1 and more than 1;

incrementing said first counter value, responsive to said step of decoding, by a value chosen from the group of 1 and 2 when the second predetermined number of data bits is determined to contain a number of errors chosen from the group of 1 and more than 1, respectively; and determining a bit error rate of the first frame at a predetermined confidence level using the first counter value and the total number of data bits included in the transmitted first frame.

2. A method for determining bit error rate in a time division multiple access (TDMA) radio communication system, the TDMA radio communication system sending and receiving radio frequency (RF) signals containing data to and from multiple radios, the RF signals are formatted before transmission and after reception, the format of the RF signals includes superframes, each superframe contains 36 frames, the frames each contains 280 data bits, 20 of 280 data bits are a synchronization word having a known pattern of data bits, 4 of the 36 frames contain a 21 data bit Radio Channel (RCH) field, the remaining 32 of 36 frames contain a 21 bit Slow Associated Control Channel (SACCH) field, the SACCH and RCH fields are encoded using the Bose, Chaudhuri, and Hocquenghen (BCH) code on sub-sections of the fields prior to formatting the data into the 21-bit SACCH and RCH fields, the BER determination method comprising the steps of:

transmitting a first superframe of data;

receiving said first superframe of data, including extracting the synchronization words, the RCH fields, and the SACCH fields to form extracted synchronization words, extracted RCH and SACCH fields;

comparing each data bit of the extracted synchronization words to the known pattern of data bits;

after comparing, incrementing a counter value when a data bit of the extracted synchronization words is found not equal to the known pattern of data bits;

formatting the RCH and SACCH fields into sub-sections;

decoding each of the RCH and SACCH sub-sections using said BCH code, thereby determining if each of said RCH and SACCH sub-sections contains 0, 1 or more than 1 error;

incrementing said counter value of the previous step of incrementing by 1 or 2, respectively, in response to said 1 or more than 1 error in said each of said RCH and SACCH sub-sections determined by said decoding step; and determining a bit error rate of said received first superframe using said counter value.

* * * * *